United States Patent
Abe et al.

(10) Patent No.: US 8,772,940 B2
(45) Date of Patent: Jul. 8, 2014

(54) SEMICONDUCTOR DEVICE

(71) Applicant: Kabushiki Kaisha Toshiba, Tokyo (JP)

(72) Inventors: Kenichi Abe, Yokohama (JP); Takuya Futatsuyama, Yokohama (JP); Jumpei Sato, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/762,787

(22) Filed: Feb. 8, 2013

(65) Prior Publication Data

US 2014/0015142 A1 Jan. 16, 2014

Related U.S. Application Data

(60) Provisional application No. 61/669,890, filed on Jul. 10, 2012.

(51) Int. Cl.
*H01L 23/48* (2006.01)

(52) U.S. Cl.
USPC ............................................................ 257/773

(58) Field of Classification Search
CPC .............. H01L 23/481; H01L 2924/14; H01L 2924/01029; H01L 2924/01078
USPC ............................................................ 257/773
See application file for complete search history.

(56) References Cited

U.S. PATENT DOCUMENTS

| | | | |
|---|---|---|---|
| 8,169,824 B2 | 5/2012 | Endo et al. | |
| 2007/0241330 A1* | 10/2007 | Nishimura et al. | 257/48 |
| 2010/0202208 A1 | 8/2010 | Endo et al. | |
| 2012/0061766 A1 | 3/2012 | Izumi et al. | |

FOREIGN PATENT DOCUMENTS

| | | |
|---|---|---|
| JP | 2010-165737 | 7/2010 |
| JP | 2010-182939 | 8/2010 |
| JP | 2012-59945 | 3/2012 |

* cited by examiner

*Primary Examiner* — Walter H Swanson
(74) *Attorney, Agent, or Firm* — Oblon, Spivak, McClelland, Maier & Neustadt, L.L.P.

(57) ABSTRACT

In a semiconductor device, a first contact-diffusion-layer is in a first well to be connected to the first well and extends in a channel width direction of a first transistor in a first well. A second contact-diffusion-layer is in the first well so as to be electrically connected to the first well and extends in a channel-length direction of the first transistor. A first contact on the first contact-diffusion-layer has a shape with a diameter in the channel-width direction larger than that in the channel-length direction when viewed from above the substrate. A second contact on the second contact-diffusion-layer has a shape with a diameter in the channel-width direction smaller than that of the first contact and a diameter in the channel-length direction almost equal to that of the first contact when viewed from above the substrate. A wiring is electrically connected to the first transistor through the second contact.

19 Claims, 5 Drawing Sheets

US 8,772,940 B2

SEMICONDUCTOR DEVICE

CROSS REFERENCE TO RELATED APPLICATIONS

This application is based upon and claims the benefit of priority from the prior U.S. Patent Application No. 61/669,890, filed on Jul. 10, 2012, the entire contents of which are incorporated herein by reference.

FIELD

The embodiments of the present invention relate to a semiconductor device.

BACKGROUND

A well contact diffusion layer (a so-called "guard ring") is frequently used in a semiconductor device to electrically connect semiconductor elements such as a transistor to a well diffusion layer. Contacts connecting wirings from a semiconductor device to a guard ring are often formed to be circular or elongated-circular in a planar shape.

In terms of reducing a chip size of a semiconductor device, contacts of a guard ring are desirably circular-hole contacts having a circular shape. However, if all the contacts of a guard ring are circular-hole contacts, contact resistances to wells are increased when some of the circular-hole contacts are not opened.

On the other hand, in terms of reducing contact resistances to wells, contacts of a guard ring are desirably elongated-hole contacts having an elongated shape. However, if all the contacts of a guard ring are elongated-hole contacts, the chip size may be increased. For example, the width of the guard ring needs to be increased to match the major axis of the elongated-hole contacts. Alternatively, distances between adjacent wirings need to be increased to match the major axis of the elongated-hole contacts.

DETAILED DESCRIPTION

A semiconductor device according to an embodiment provides a semiconductor substrate. A first well of a first conductivity type is provided on the semiconductor substrate. A first transistor is provided in the first well. A first contact diffusion layer is provided in the first well so as to be electrically connected to the first well and extends in a channel width direction of the first transistor. A second contact diffusion layer is provided in the first well so as to be electrically connected to the first well and extends in a channel length direction of the first transistor. A first contact is provided on the first contact diffusion layer and has a shape with a diameter in the channel width direction larger than that in the channel length direction when the first contact is viewed from above the semiconductor substrate. A second contact is provided on the second contact diffusion layer and has a shape with a diameter in the channel width direction smaller than that of the first contact and a diameter in the channel length direction almost equal to that of the first contact when the second contact is viewed from above the semiconductor substrate. A wiring is electrically connected to at least a part of the first transistor through the second contact.

Embodiments will now be explained with reference to the accompanying drawings. The present invention is not limited to the embodiments.

Embodiments described below can be applied to various types of memories that have a well contact diffusion layer (a so-called "guard ring"), such as a magnetic random access memory (MRAM), a resistance random access memory (ReRAM), a phase-change random access memory (PRAM), and a ferroelectric random access memory (FeRAM). The embodiments mentioned below can be also applied to arbitrary semiconductor devices other than the memories as long as the semiconductor devices have a well contact diffusion layer.

First Embodiment

Figure 1:
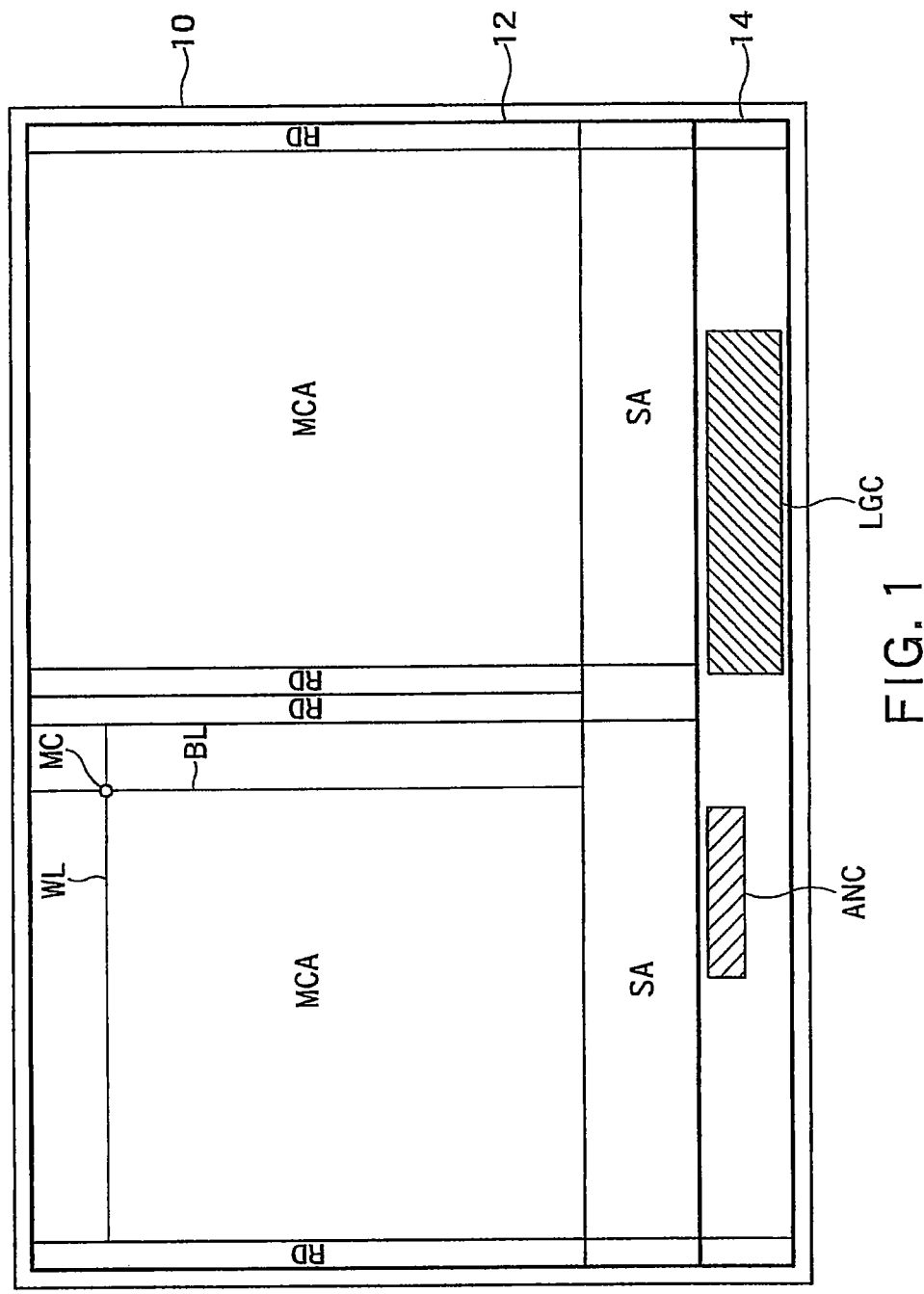
FIG. 1 is a plan view showing a configuration of a semiconductor device according to a first embodiment.

FIG. 1 is a plan view showing a configuration of a semiconductor device according to a first embodiment. In the first embodiment, the semiconductor device is a memory 10 and includes a core area 12 and a peripheral circuit area 14. The memory 10 is formed as one semiconductor chip.

The core area 12 includes memory cell arrays MCA, row decoders RD, and sense amplifiers SA. Each of the memory cell arrays MCA includes a plurality of memory cells MC arranged two-dimensionally in a matrix, for example. Each of the memory cells MC is connected to a bit line BL and a word line WL. The memory cell MC is connected to the sense amplifier SA via the bit line BL and connected to the row decoder RD via the word line WL. The core area 12 further includes a driver that drives the bit lines BL or the word lines WL, a buffer that temporarily stores data therein, and the like (not shown).

The peripheral circuit area 14 includes an analog circuit ANC including a booster circuit that boosts a power-supply voltage, an I/O circuit, and the like, and a logic circuit LGC including a control circuit for the core area 12, and the like. The analog circuit ANC is designed by using a semi-custom layout or a full-custom layout. The logic circuit LGC is designed by using an automatic placement and routing tool (APR).

Generally, contacts in the core area 12 are designed according to a design rule different from that of contacts in the peripheral circuit area 14. The contacts in the peripheral circuit area 14 according to the first embodiment are explained below.

Figure 2:
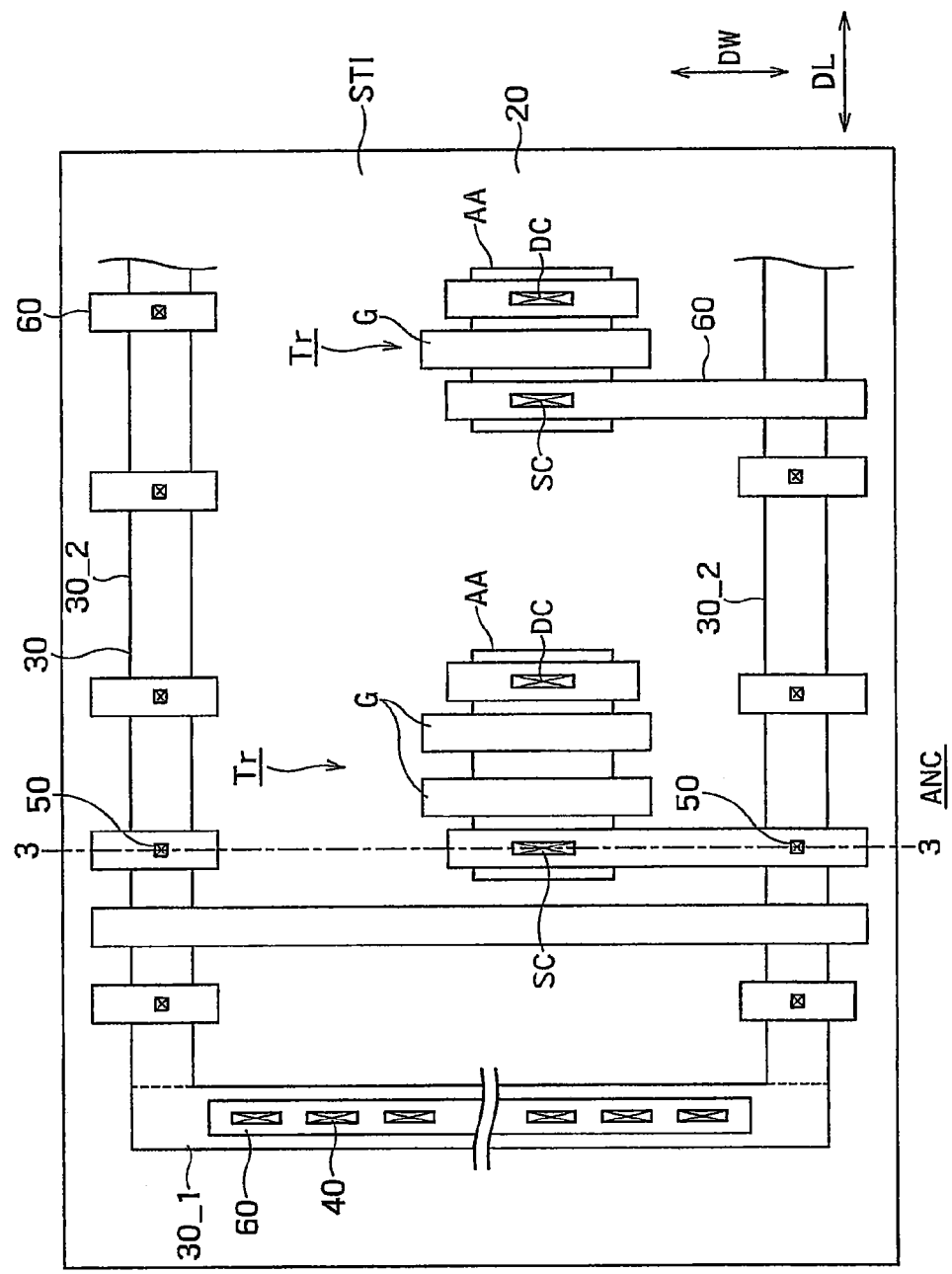
FIG. 2 is a schematic plan view showing a configuration of the analog circuit ANC in the peripheral circuit area 14.
Figure 3:
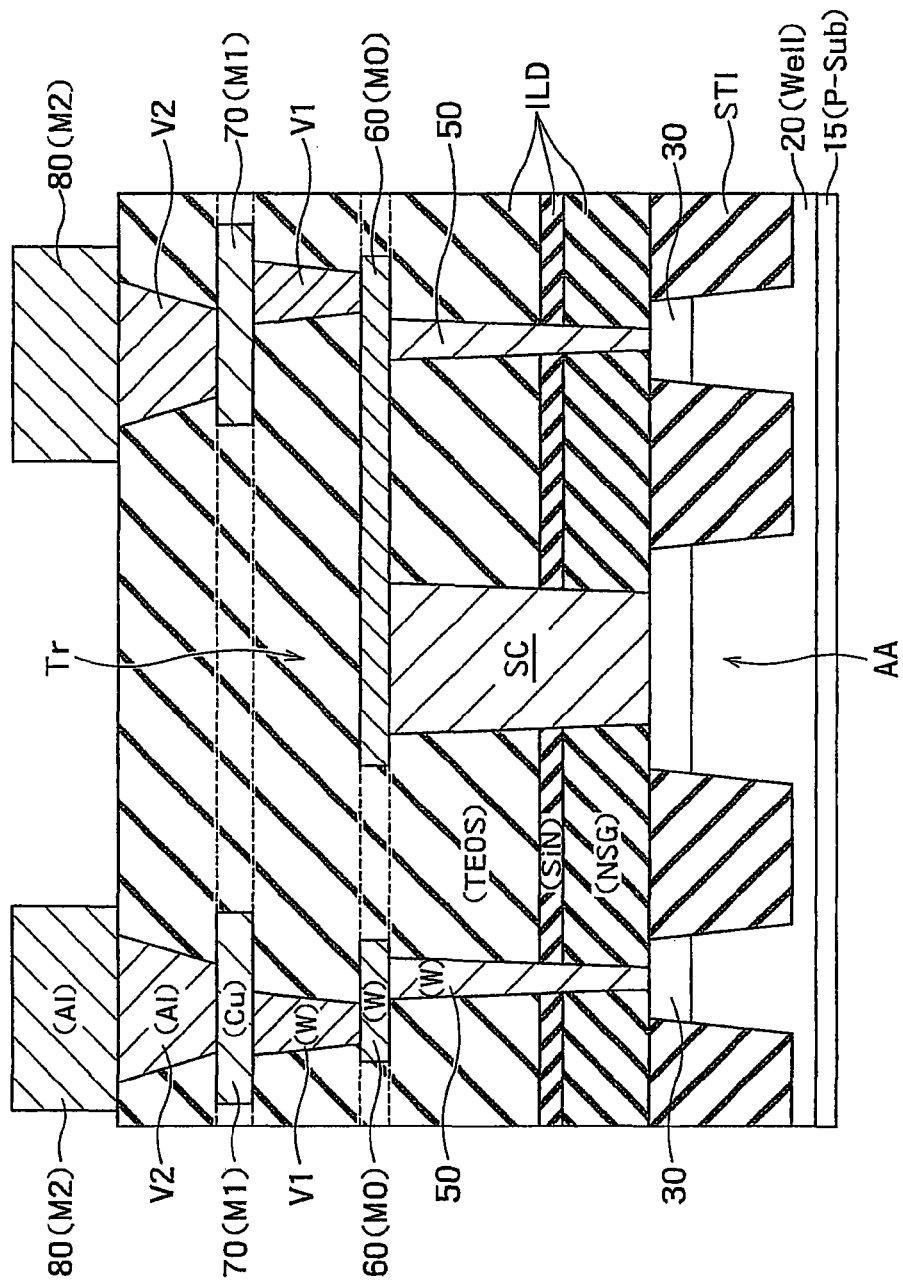
FIG. 3 is a cross-sectional view along the line 3-3 in FIG. 2.

FIG. 2 is a schematic plan view showing a configuration of the analog circuit ANC in the peripheral circuit area 14. FIG. 3 is a cross-sectional view along the line 3-3 in FIG. 2.

The analog circuit ANC includes a well diffusion layer 20 provided on a semiconductor substrate (for example, a p-type silicon substrate) 15 as shown in FIG. 3. Active areas AA and isolation areas STI are formed on the well diffusion layer 20. Semiconductor elements such as transistors Tr are formed in the active areas AA. The isolation areas STI are provided between adjacent ones of the active areas AA and electrically isolate the active areas AA from each other.

Furthermore, a well contact diffusion layer 30 is provided on the well diffusion layer 20. The well contact diffusion layer is formed of an impurity diffusion layer of the same conductivity type as that of the well diffusion layer 20 in order to electrically connect a part of the respective transistors Tr to the well diffusion layer 20 (or the semiconductor substrate 15). That is, the well contact diffusion layer 30 is a so-called guard ring electrically connected to the well diffusion layer 20. However, the shape of the well contact diffusion layer 30 is not limited to a ring shape as long as the well contact diffusion layer 30 has a function of electrically connecting a part of the respective transistors Tr to the well diffusion layer 20.

As shown in FIG. 2, the well contact diffusion layer 30 includes first contact diffusion layers 30_1 and second contact diffusion layers 30_2. The first contact diffusion layers 30_1 are parts of the well contact diffusion layer 30, which parts extend in a channel width direction DW of the transistors Tr. The second contact diffusion layers 30_2 are parts of the well contact diffusion layer 30, which parts extend in a channel length direction DL of the transistors Tr. The channel width direction DW can be also referred to as an extension direction of first-layer metal wirings (M0) 60 or the first contact diffusion layers 30_1. The channel length direction DL can be also referred to as an extension direction of the second contact diffusion layers 30_2.

The two first contact diffusion layers 30_1 are provided on both sides of the channel length direction DL of the periphery of the analog circuit ANC, respectively. The two second contact diffusion layers 30_2 are provided on both sides of the channel width direction DW of the periphery of the analog circuit ANC, respectively. Accordingly, the well contact diffusion layer 30 is arranged in a rectangular ring shape in the planar layout so as to surround the transistors Tr of the analog circuit ANC. However, the well contact diffusion layer 30 is not limited to the ring shape as mentioned above. For example, the well contact diffusion layer 30 can be arranged in a U shape as required according to the layout design.

A plurality of first contacts 40 are formed on the first contact diffusion layers 30_1. A diameter in the channel width direction DW of the first contacts 40 is larger than that in the channel length direction DL thereof when the first contacts 40 are viewed from above a surface of the semiconductor substrate 15. That is, the first contacts 40 are elongated-hole contacts having an elongated planar shape. For example, a planar shape of the first contacts 40 can be substantially elliptical, substantially elongate-circular, substantially rectangular, or the like. Even when the planar shape of the first contacts 40 is rectangular in a photolithography mask, the planar shape of the first contacts 40 to be actually formed becomes elongated-circular or elliptical in many cases.

A plurality of second contacts 50 are formed on the second contact diffusion layers 30_2. A diameter in the channel width direction DW of the second contacts 50 is smaller than that of the first contacts 40 and a diameter in the channel length direction DL thereof is almost equal to that of the first contacts 40 when the second contacts 50 are viewed from above the surface of the semiconductor substrate 15. In the first embodiment, the second contacts 50 have almost the same diameters in the channel width direction DW and in the channel length direction DL and are circular-hole contacts having a circular (or a rectangular) shape. For example, a planar shape of the second contacts 50 can be substantially circular, substantially square, or the like. However, it suffices that the planar shape of the second contacts 50 is more like a square or a circle as compared to the first contacts 40, and the shape is not specifically limited to a substantial circle or a substantial square. Even when the planar shape of the second contacts 50 is square in the photolithography mask, the planar shape of the second contacts 50 to be actually formed becomes circular in many cases. Therefore, as mentioned above, the second contacts 50 are also referred to as "circular-hole contacts".

The diameter in the channel length direction DL (length of one short side) of the first contacts 40 and the diameter (length of one side) of the second contacts 50 are almost equal to a minimum processing size F (Feature size) which is the minimum size of a line or a space processed by using a lithography technique and an etching technique in a semiconductor manufacturing process. Accordingly, a layout area of the analog circuit ANC can be decreased.

The first and second contacts 40 and 50 are formed to be embedded into an inter-layer dielectric film ILD formed on the well contact diffusion layer 30 and are connected to the first-layer metal wirings 60 formed on the inter-layer dielectric film ILD.

Contacts DC and SC of each of the transistors Tr have such a shape that has a diameter in the channel width direction DW is larger than that in the channel length direction DL when the contacts DC and SC are viewed from above the surface of the semiconductor substrate 15. That is, the contacts DC and SC of each of the transistors Tr are elongated-hole contacts having the major axes in the same direction as that of the first contacts 40. In this case, DC denotes a drain contact and SC denotes a source contact. G denotes a gate electrode of the transistor Tr.

The first-layer metal wirings (M0) 60 are provided on the inter-layer dielectric film ILD and the first and second contacts 40 and 50. In the first embodiment, the first-layer metal wirings 60 extend in the channel width direction DW. Because the second contacts 50 are the circular-hole contacts and have the diameter in the channel length direction DL almost equal to the feature size F, distances between the first-layer metal wirings 60 adjacent to each other can be reduced. Accordingly, the layout area of the analog circuit ANC can be decreased.

Connection wirings in the channel length direction DL can be formed by using second-layer metal wirings (M1) 70, third-layer metal wirings (M2) 80, or the like, which are upper layers than the first-layer metal wirings 60 as shown in FIG. 3. For example, in a standard cell or the like used in a peripheral circuit area of a NAND flash memory, a signal line is arranged to extend in the channel width direction DW and a power line is arranged to extend in the channel length direction DL. The power line is formed by using a metal wiring on an upper layer than the signal line. Therefore, the signal line is formed as the first-layer metal wiring 60, for example, and the power line is formed as the second-layer metal wiring 70, for example. In FIG. 2, only the first-layer metal wirings 60 are shown, and the second-layer metal wirings 70 and the third-layer metal wirings 80 on the upper layers are not shown.

As shown in FIG. 3, the second-layer metal wirings 70 are electrically connected to the first-layer metal wirings 60 through via contacts V1. The third-layer metal wirings 80 are electrically connected to the second-layer metal wirings 70 through via contacts V2.

The first-layer metal wirings 60 electrically connect at least a part of the respective transistors Tr to the well contact diffusion layer 30 through the second contacts 50. For example, the first-layer metal wiring 60 electrically connects the source contact SC of the transistor Tr to the second contact diffusion layer 30_2 through the second contact 50 as shown in FIG. 2.

The cross section of the first contact 40 in the channel length direction DL is the same as that of the second contact 50 shown in FIG. 3 and the cross section of the first contact 40 in the channel width direction DW is the same as that of the source contact SC shown in FIG. 3. Therefore, the cross section of the first contact 40 is not shown.

In the first embodiment, the analog circuit ANC includes N-FETs formed in the P-well 20 and having a high current drive capability. However, the analog circuit ANC can include P-FETs formed in an N-well.

In the first embodiment, the first contacts 40 are the elongated-hole contacts having the major axis in the channel width direction DW (the extension direction of the first-layer metal wirings 60 and the first contact diffusion layers 30_1). Accordingly, the first contacts 40 can connect between the first-layer metal wirings 60 and the well contact diffusion layer 30 with low resistances. When a potential of the well 20 is set from outside of the semiconductor device through the first contacts 40, the well 20 can be appropriately set to a desired potential because the resistances between the first-layer metal wirings 60 and the well contact diffusion layer 30 are low. As a result, a risk of latch-up in the analog circuit ANC can be decreased.

The first contacts 40 have the major axis in the same direction as the extension direction of the first-layer metal wirings 60 and the first contact diffusion layers 30_1. Therefore, the layout area of the analog circuit ANC itself is not increased even when the first contacts 40 are the elongated-hole contacts.

The planar shape of the first contacts 40 has the major axis in the same direction as that of major axes of a source layer S and a drain layer D of each of the transistors Tr. The first-layer metal wirings 60 extend in the major axis direction of the source layer S and the drain layer D to be connected to the source layer S and the drain layer D with low resistances even when the width of the first-layer metal wirings 60 is small. Therefore, by setting the major axis direction of the first contacts 40 to be the same as that of the source layer S and the drain layer D, the layout area of the analog circuit ANC is not increased even when the first contacts 40 are the elongated-hole contacts as mentioned above. Furthermore, because the width of the first-layer metal wirings 60 is narrow and the second contacts 50 are the circular-hole contacts, distances between adjacent ones of the first-layer metal wirings 60 can be reduced.

The second contacts 50 are circular-hole contacts and have axis lengths almost equal to the feature size F. Therefore, distances (pitches) between the first-layer metal wirings 60 adjacent to each other can be reduced as mentioned above. Furthermore, the width of the second contact diffusion layers 30_2 can be narrowed. For example, if the second contacts 50 are long in the channel length direction DL, the distances between the first-layer metal wirings 60 adjacent to each other need to be increased to match the major axis of the second contacts 50. If the second contacts 50 are long in the channel width direction DW, the width (a width in the channel width direction DW) of the second contact diffusion layers 30_2 needs to be increased to match the major axis of the second contacts 50. In these cases, the layout area of the analog circuit ANC is increased.

On the other hand, the second contacts 50 are the circular-hole contacts in the first embodiment and thus the distances between the first-layer metal wirings 60 adjacent to each other can be reduced and the width of the second contact diffusion layers 30_2 can be narrowed. As a result, the layout area of the analog circuit ANC can be decreased.

When the second contacts 50 are the circular-hole contacts, resistances between the first-layer metal wirings 60 and the well contact diffusion layer 30 are increased and a concern about a risk of latch-up rises. However, because the first contacts 40 connect the first-layer metal wirings 60 to the well contact diffusion layer 30 with low resistances in the first embodiment, the risk of latch-up is decreased. That is, in the first embodiment, it is possible to decrease the layout area of the semiconductor device while reducing the resistances between the first-layer metal wirings 60 and the well contact diffusion layer 30 by a combined use of the first contacts 40 (elongated-hole contacts) and the second contacts 50 (circular-hole contacts).

To reduce a contact resistance between the transistor Tr and the well contact diffusion layer 30, two or more second contacts 50 can be arranged within a certain distance from each of the transistors Tr. This further reduces the resistance between the first-layer metal wiring 60 and the well contact diffusion layer 30 and thus further decreases the risk of latch-up. By placing the second contacts 50 within a certain distance from each of the transistors Tr, even if some of the second contacts 50 are not opened, opening of the other second contacts 50 enables the transistor Tr to be connected to the well contact diffusion layer 30 in the vicinity of the some of second contacts 50. The certain distance is set based on impurity concentrations of the well contact diffusion layer 30 and of the well 20, the size of the second contacts 50, and the like.

The analog circuit ANC is sometimes mounted in a mixed manner with a logic circuit. The well contact diffusion layer 30, the first contacts 40, and the second contacts 50 according to the first embodiment can be also applied to such a mixedly mounted circuit having an analog circuit and a logic circuit. In this case, it suffices to form the well contact diffusion layer 30, the first contacts 40, and the second contacts 50 to surround the mixedly mounted circuit in the same manner as in the arrangement shown in FIG. 2.

Second Embodiment

Figure 4:
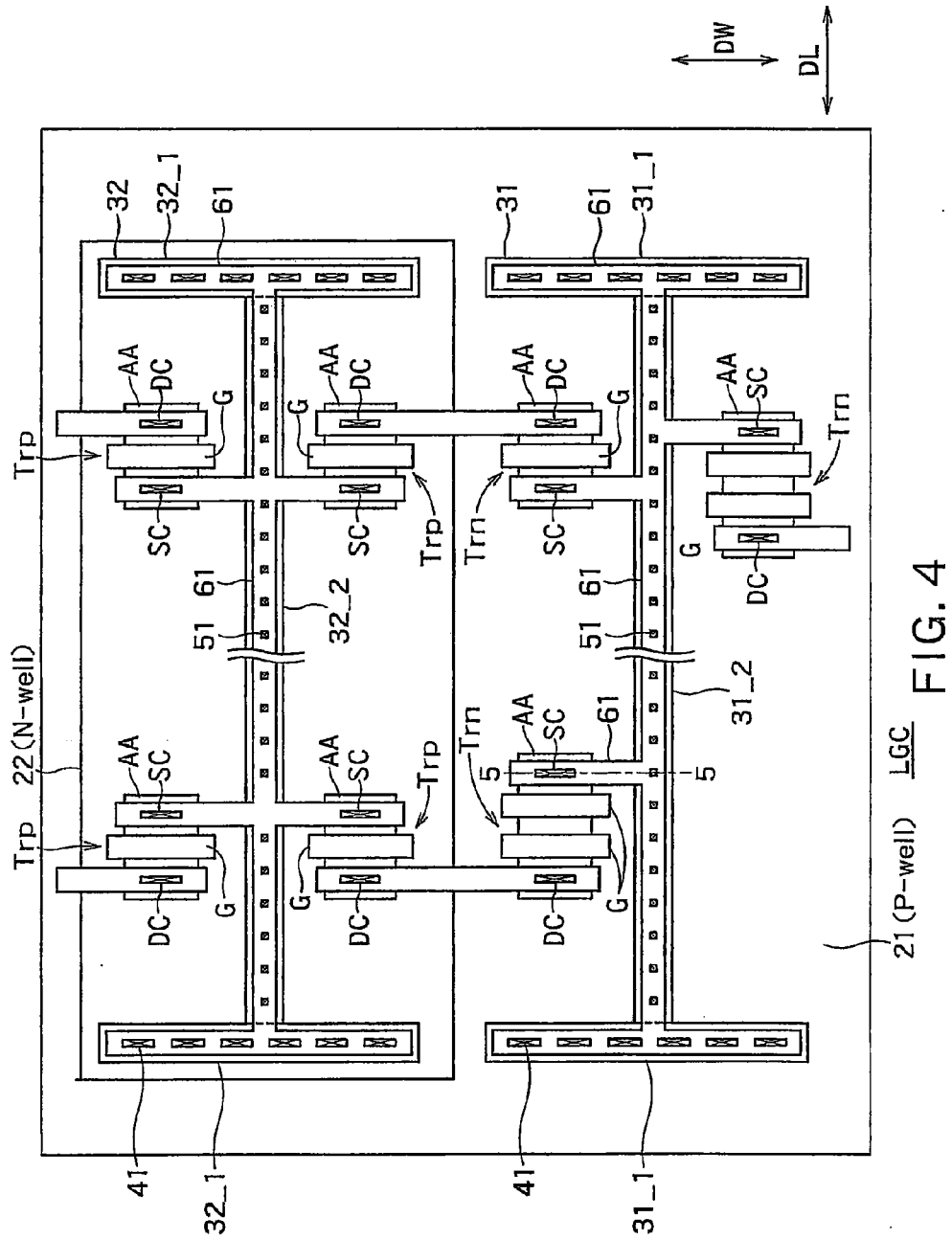
FIG. 4 is a schematic plan view showing a configuration of a logic circuit LGC in the peripheral circuit area 14.
Figure 5:
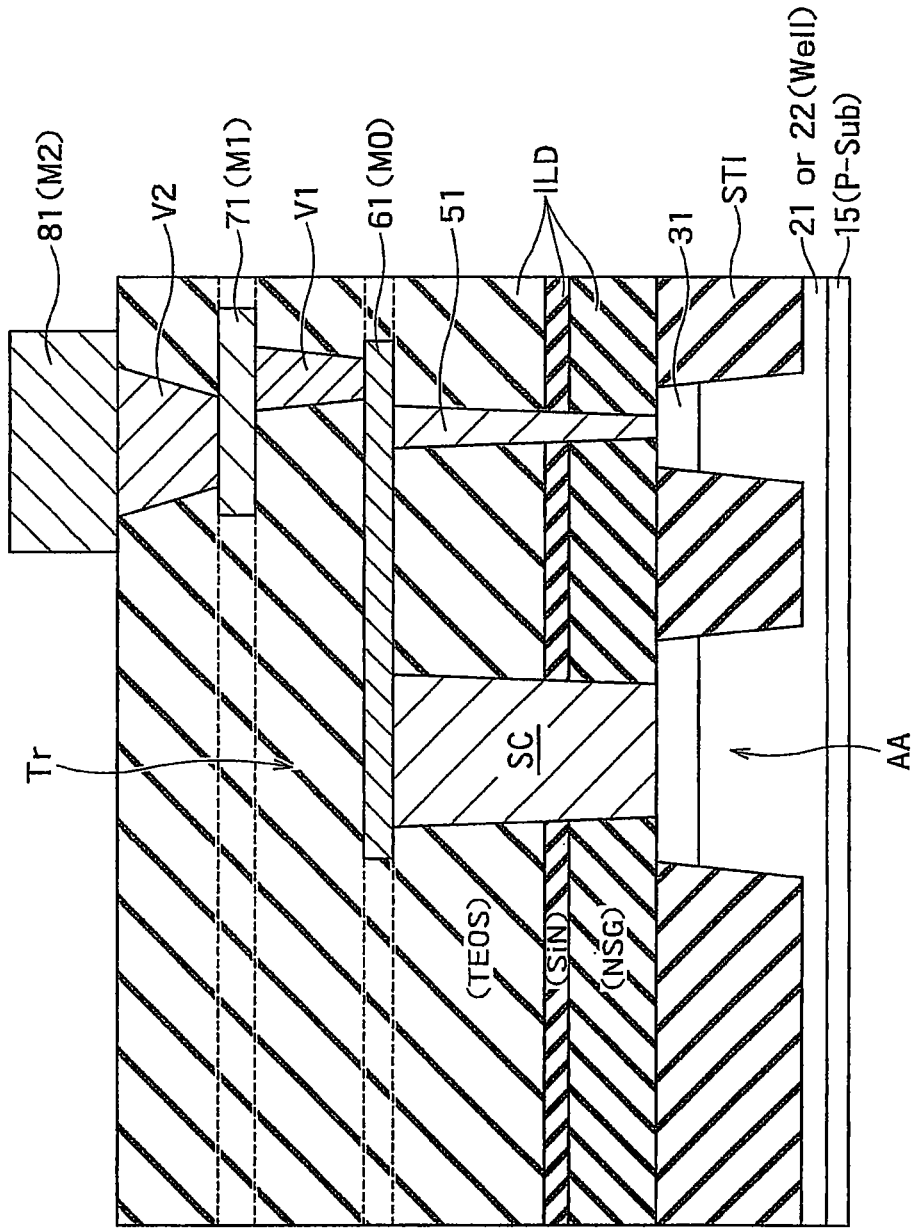
FIG. 5 is a cross-sectional view along the line 5-5 in FIG. 4.

FIG. 4 is a schematic plan view showing a configuration of a logic circuit LGC in the peripheral circuit area 14. FIG. 5 is a cross-sectional view along the line 5-5 in FIG. 4. In a second embodiment, the first and second contacts mentioned above are applied to the logic circuit LGC.

Generally, a layout of the logic circuit LGC is formed by a combination of standard functional blocks (standard cells) configured by using the APR. Therefore, the logic circuit LGC often has a well structure in which P-wells 21 and N-wells 22 are alternately and regularly arranged. Generally, the P-well 21 in which N-FETs are formed is set at a reference voltage (VSS) and the N-well 22 in which P-FETs are formed is connected to a power-supply voltage (VDD). In some cases, an N-type transistor Trn in the P-well 21 and a P-type transistor Trp in the N-well 22 are connected between the P-well 21 and the N-well 22 adjacent to each other. That is, the logic circuit LGC includes a CMOS (Complementary Metal-Oxide Semiconductor) structure in some cases.

In this case, a planar layout of each of well contact diffusion layers 31 and 32 in the logic circuit LGC is formed in an H shape. That is, the well contact diffusion layers 31 and 32 can be divided into first contact diffusion layers 31_1 and 32_1 extending in the channel width direction DW and second contact diffusion layers 31_2 and 32_2 extending in the channel length direction DL, respectively. The contact diffusion layers 31_1 and 31_2 are included in a P$^+$ contact diffusion layer 31 formed in the P-well 21 and the contact diffusion layers 32_1 and 32_2 are included in an N$^+$ contact diffusion layer 32 formed in the N-well 22.

The contact diffusion layers 31_1 (or 32_1) are provided on both sides of the channel length direction DL of the periphery of the logic circuit LGC, respectively. The second contact diffusion layer 31_2 (or 32_2) is provided to traverse a central part of the logic circuit LGC between the contact diffusion layers 31_1 (or 32_1) on the both sides of the logic circuit LGC.

By forming each of the well contact diffusion layers 31 and 32 in the H shape in this way, first-layer metal wirings 61 for well contacts can be arranged inside the wells 21 and 22, respectively. Accordingly, congestion of the first-layer metal wirings 61 at a boundary between the P-well 21 and the N-well 22 adjacent to each other can be suppressed. However, shapes of the well contact diffusion layers 31 and 32 are not limited to the H shape and can be changed as required according to the layout design.

Other configurations in the wells 21 and 22 of the logic circuit LGC can be basically the same as corresponding configurations in the analog circuit ANC. However, because intended uses of the transistors of the logic circuit LGC and the transistors of the analog circuit ANC are different, these transistors may be greatly different in sizes (W/L) or the like. Configurations in the N-well 22 of the logic circuit LGC can be basically the same as those in the P-well 21 while conductivity types thereof are different from those of the configurations in the P-well 21.

Planar shapes of contacts 41 and 51 are explained below. A plurality of first contacts 41 are formed on the first contact diffusion layers 31_1 and 32_1. A planar shape of the first contacts 41 has a diameter in the channel width direction DW larger than that in the channel length direction DL when the first contacts 41 are viewed from above the surface of the silicon substrate 15. That is, the first contacts 41 are elongated-hole contacts as the contacts 40.

A plurality of second contacts 51 are formed on the second contact diffusion layers 31_2 and 32_2. A planar shape of the second contacts 51 has a diameter in the channel width direction DW smaller than that of the first contacts 41 and a diameter in the channel length direction DL is almost equal to that of the first contacts 41 when the second contacts 51 are viewed from above the silicon substrate 15. For example, the second contacts 51 are circular-hole contacts as the contacts 50.

The diameter in the channel length direction DL (length on one short side) of the first contacts 41 and the diameter (length on one side) of the second contacts 51 are almost equal to the feature size F in the semiconductor manufacturing process. Accordingly, a layout area of the logic circuit LGC can be decreased.

The first and second contacts 41 and 51 are formed to be embedded into an inter-layer dielectric film ILD and are connected to the first-layer metal wirings 61 formed on the inter-layer dielectric film ILD, respectively.

The first-layer metal wirings (M0) 61 are provided on the inter-layer dielectric film ILD and the first and second contacts 41 and 51. In the second embodiment, the first-layer metal wirings 61 other than those located on the second contact diffusion layers 31_2 and 32_2 extend in the channel width direction DW. The first-layer metal wirings 61 electrically connect at least a part of the transistors Trp and Trn to the well contact diffusion layers 31 and 32 through the second contacts 51. Because the second contacts 51 are the circular-hole contacts and have the diameter in the channel length direction DL almost equal to the feature size F, distances between the first-layer metal wirings 61 adjacent to each other can be reduced. Accordingly, the layout area of the logic circuit LGC can be decreased. Furthermore, connection wirings in the channel length direction DL can be formed by using second-layer metal wirings (M1) 71, third-layer metal wirings (M2) 81, or the like, which are upper layers than the first-layer metal wirings 61 as shown in FIG. 5, as in the first embodiment.

As shown in FIG. 5, the second-layer metal wirings 71 are electrically connected to the first-layer metal wirings 61 through the via contacts V1. The third-layer metal wirings 81 are electrically connected to the second-layer metal wirings 71 through the via contacts V2.

According to the second embodiment, the first contacts 41 are the elongated-hole contacts having the major axis in the channel width direction DW (the extension direction of the first-layer metal wirings 61 and the first contact diffusion layers 31_1 and 32_1). The second contacts 51 are the circular-hole contacts and have the diameter almost equal to the feature size F. Accordingly, the logic circuit LGC according to the second embodiment can obtain advantages identical to those of the first embodiment. That is, in the second embodiment, it is possible to decrease the layout area of the semiconductor device while reducing the resistances between the first-layer metal wirings 61 and the well contact diffusion layers 31 and 32 by a combined use of the first contacts 41 (elongated-hole contacts) and the second contacts 51 (circular-hole contacts).

Also in the second embodiment, two or more second contacts 51 can be arranged within a certain distance from each of the transistors Tr as in the first embodiment. This further reduces the resistance between the first-layer metal wiring 61 and the well contact diffusion layer 31 or 32. Even if some of the second contacts 51 are not opened, opening of the other second contacts 51 enables the transistor Tr to be connected to the well contact diffusion layer 31 or 32 in the vicinity of the some of the second contacts 51.

The embodiments described above are applied to a single-well structure. However, these embodiments can be applied to a double-well structure or a triple-well structure. Also in these cases, the first contacts 40 and 41 connect between wells and a power supply with low resistances, thereby it is possible to suppress a potential of each of the wells from floating.

The analog circuit ANC according to the first embodiment and the logic circuit LGC according to the second embodiment can be combined. Accordingly, the entire layout size of the semiconductor device can be further decreased.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a semiconductor substrate;
   a first well of a first conductivity type provided on the semiconductor substrate;
   a first transistor provided in the first well;
   a first contact diffusion layer provided in the first well so as to be electrically connected to the first well, the first contact diffusion layer extending in a channel width direction of the first transistor;
   a second contact diffusion layer provided in the first well so as to be electrically connected to the first well, the second contact diffusion layer extending in a channel length direction of the first transistor;

a first contact provided on the first contact diffusion layer, the first contact having a shape with a diameter in the channel width direction larger than a diameter in the channel length direction when the first contact is viewed from above the semiconductor substrate;

a second contact provided on the second contact diffusion layer, the second contact having a shape with a diameter in the channel width direction smaller than that of the first contact and a diameter in the channel length direction almost equal to that of the first contact when the second contact is viewed from above the semiconductor substrate; and a wiring electrically connected to at least a part of the first transistor through the second contact.

2. The device of claim 1, wherein
first transistor is included in an analog circuit,
a plurality of the first contact diffusion layers are provided on both sides of the channel length direction of a periphery of the analog circuit, respectively, and
a plurality of second contact diffusion layers are provided on both sides of the channel width direction of the periphery of the analog circuit, respectively.

3. The device of claim 2, wherein
the first transistor is included in an analog circuit, and
the first and second contact diffusion layers are provided in a ring shape so as to surround the analog circuit.

4. The device of claim 1, wherein
the first transistor is included in a logic circuit,
a plurality of first contact diffusion layers are provided on both sides of the channel length direction of a periphery of the logic circuit, respectively, and
the second contact diffusion layer is provided so as to be across the logic circuit between the first contact diffusion layers on the both sides of the logic circuit.

5. The device of claim 4, wherein
the first transistor is included in the logic circuit, and
the first and second contact diffusion layers are provided in an H shape so as to be across the logic circuit.

6. The device of claim 1, wherein a contact of the first transistor has a shape with a diameter in the channel width direction larger than a diameter in the channel length direction when the contact is viewed from above the semiconductor substrate.

7. The device of claim 2, wherein a contact of the first transistor has a shape with a diameter in the channel width direction longer than a diameter in the channel length direction when the contact is viewed from above the semiconductor substrate.

8. The device of claim 4, wherein a contact of the first transistor has a shape with a diameter in the channel width direction longer than a diameter in the channel length direction when the contact is viewed from above the semiconductor substrate.

9. The device of claim 1, wherein the first contact is substantially elliptical, substantially elongated-circular, or substantially rectangular when the first contact is viewed from above the semiconductor substrate.

10. The device of claim 1, wherein the second contact is substantially circular or substantially square when the second contact is viewed from above the semiconductor substrate.

11. The device of claim 2, wherein the first contact is substantially elliptical, substantially elongated-circular, or substantially rectangular when the first contact is viewed from above the semiconductor substrate.

12. The device of claim 2, wherein the second contact is substantially circular or substantially square when the second contact is viewed from above the semiconductor substrate.

13. The device of claim 4, wherein the first contact is substantially elliptical, substantially elongated-circular, or substantially rectangular when the first contact is viewed from above the semiconductor substrate.

14. The device of claim 4, wherein the second contact is substantially circular or substantially square when the second contact is viewed from above the semiconductor substrate.

15. The device of claim 1, comprising:
a memory part comprising a memory cell array including a plurality of memory cells, a decoder configured to decode addresses of the memory cells, and a sense amplifier configured to detect data stored in the memory cells; and
a peripheral circuit area configured to control the memory part, wherein
the first transistor, the first well, the first and second contact diffusion layers, and the first and second contacts are provided in the peripheral circuit area.

16. The device of claim 15, wherein contacts in the memory part respectively have a shape with a diameter in the channel width direction almost equal to a diameter in the channel length direction and have the diameters smaller than those of the second contact when the contacts in the memory part are viewed from above the semiconductor substrate.

17. The device of claim 1, wherein a plurality of the wirings are provided on an inter-layer dielectric film and the second contact which is provided on the first and second contact diffusion layers, and the wirings extend in the channel width direction.

18. The device of claim 1, wherein a length or a diameter in the channel length direction of the first contact is almost equal to a least processing size in a semiconductor manufacturing process.

19. The device of claim 1, wherein a length of one side or a diameter of the second contact is almost equal to a least processing size in a semiconductor manufacturing process.

* * * * *